United States Patent
Balaga et al.

(10) Patent No.: US 10,020,059 B1
(45) Date of Patent: Jul. 10, 2018

(54) SWITCHABLE IMPEDANCE DRIVERS AND RELATED SYSTEMS AND METHODS

(71) Applicant: SanDisk Technologies LLC, Plano, TX (US)

(72) Inventors: Muralikrishna Balaga, Andhra Pradesh (IN); Vinayak Ghatawade, Karnataka (IN); Aditya Pradhan, Karnataka (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/486,168

(22) Filed: Apr. 12, 2017

(51) Int. Cl.
   *G11C 16/06* (2006.01)
   *G11C 16/12* (2006.01)
   *H03K 19/00* (2006.01)

(52) U.S. Cl.
   CPC ......... *G11C 16/12* (2013.01); *H03K 19/0005* (2013.01)

(58) Field of Classification Search
   CPC .................................. H03K 19/0005
   USPC .................................... 365/185.23
   See application file for complete search history.

(56) References Cited

U.S. PATENT DOCUMENTS

| 5,371,420 A | 12/1994 | Nakao |
| 5,717,343 A | 2/1998 | Kwong |
| 5,894,238 A * | 4/1999 | Chien ............. H03K 19/00361 326/26 |
| 2012/0008428 A1* | 1/2012 | Yoon ................. G11C 7/1051 365/189.07 |
| 2017/0162251 A1* | 6/2017 | Wang ................. H04L 25/028 |

* cited by examiner

*Primary Examiner* — Hoai V Ho
(74) *Attorney, Agent, or Firm* — Stoel Rives LLP (57) ABSTRACT

A memory device includes an electrical line operably coupled to a plurality of memory cells, and a switchable impedance driver operably coupled to the electrical line. An electronic circuit includes a first driver having a first output impedance, and a second driver having a second output impedance that is less than the first output impedance. The first driver and the second driver are operably coupled in parallel to an output of the electronic circuit. The electronic circuit includes logic circuitry to enable the second driver during switching of a digital output of the driver. A method includes driving an output with both the first driver and the second driver when an input switches between logic levels, and disabling the second driver when the output reaches a desired logic level following the switch between logic levels of the input.

21 Claims, 6 Drawing Sheets

SWITCHABLE IMPEDANCE DRIVERS AND RELATED SYSTEMS AND METHODS

TECHNICAL FIELD

This disclosure relates to drivers with switchable output impedance and related systems and methods. More specifically, this disclosure relates to switchable impedance drivers for driving memory lines in memory devices.

DETAILED DESCRIPTION

The storage industry is increasingly moving toward higher data storage capacity and higher interface speed requirements. Higher data storage capacity is sometimes accompanied by larger numbers of memory elements (e.g., memory cells) being coupled to the same electrical lines in memory devices, and longer traces for these electrical lines. As such, electrical lines of memory devices may have relatively high impedance (e.g., resistive, reactive, or a combination thereof).

Long, narrow signal lines operating at high interface speeds may create design difficulties. For example, inputs and outputs (I/Os) may operate at data rates greater than or equal to 800 megabits per second (MBps) while driving larger capacitive loads (e.g., about 30 picofarads (pF)) in the presence of mismatches between output impedance of driving buffers and channel traces. Strong drivers may be used to drive capacitive loads at high data rates. Strong drivers, however, may have low output impedance compared to the signal lines (and load), which may create an impedance mismatch, particularly in multi-die memory devices, resulting in signal reflections, deteriorating signal integrity (e.g., high overshoot/undershoot and reflections), and so on.

In some embodiments, a method of operating a driver includes delivering a digital data input to a first sub-driver and logic circuitry for controlling a second sub-driver operably coupled to an output of the driver in parallel with an output of the first sub-driver. The method also includes driving a digital data output to the output of the driver with both the first sub-driver and the second sub-driver when the digital data input switches between logic levels, and disabling the second sub-driver when the digital data output reaches a desired logic level following the switch between logic levels of the digital data input. The method further includes driving the digital data output to the output with the first sub-driver and not the second sub-driver while the second sub-driver is disabled. In some embodiments, driving the digital data output to the output with the first sub-driver and not the second sub-driver includes driving the digital data output to the output while an output impedance of the driver matches an impedance of the output. In some embodiments, driving a digital data output to the output includes driving a voltage bias for a memory operation to the output. In some embodiments, driving a digital data output to the output with both the first sub-driver and the second sub-driver includes driving the digital data output to the output while a magnitude of an output impedance of the driver is less than a magnitude of an impedance of the output. In some embodiments, driving the digital data output to the output while a magnitude of an output impedance of the driver is less than a magnitude of an impedance of the output includes driving the digital data output to the output while the magnitude of the output impedance of the driver is less than the magnitude of the impedance of the output by at least about fifty percent (50%).

In some embodiments, an electronic circuit includes a first driver operably coupled to an output of the electronic circuit. The first driver has a first output impedance. The electronic circuit also includes a second driver operably coupled to the output in parallel with the first driver. The second driver has a second output impedance that is lower than the first output impedance when the second sub-driver is enabled to drive the output, and higher than the first output impedance when the second sub-driver is disabled from driving the output. The electronic circuit also includes logic circuitry operably coupled to the input, the output, and the second sub-driver. The logic circuitry is configured to enable the second sub-driver to drive the output during switching of the digital data output between different logic levels. The logic circuitry is also configured to disable the second sub-driver from driving the output otherwise. In some embodiments, the output is operably coupled to a memory line, and the memory line is operably coupled to a plurality of memory cells. In some embodiments, each of the first driver and the second driver includes a Complementary Metal-Oxide-Semiconductor (CMOS) inverter. In some embodiments, each of the first driver and the second driver includes a sub-output operably coupled between a pull-up transistor and a pull-down transistor. In some embodiments, each of the first driver and the second driver includes a pull-up transistor, a pull-up resistor, a pull-down resistor, and a pull-down transistor coupled in series, and a sub-output operably coupled between the pull-up resistor and the pull-down resistor. In some embodiments, the first output impedance is configured to match an impedance of the output when coupled to one or more loads. In some embodiments, the one or more loads include a far-end open circuit. In some embodiments, the one or more loads include a primarily capacitive load. In some embodiments, the logic circuitry includes a pull-up logic operably coupled to a gate of a pull-up transistor of the second sub-driver, pull-down logic operably coupled to a gate of a pull-down transistor of the second sub-driver, and detector logic operably coupled between the output and each of the pull-up logic and the pull-down logic. The detector logic is configured to control the pull-up logic and the pull-down logic to enable and disable the pull-up transistor and the pull-down transistor.

In some embodiments, a memory device includes a plurality of memory cells, an electric line operably coupled to a portion of the plurality of memory cells, and a switchable driver. The switchable driver includes an output operably coupled to the electrical line and is configured to drive the electrical line with a digital output and operate in a first output impedance state during a switch of the digital output between different logic levels. The switchable driver is also configured to operate in a second output impedance state having an impedance magnitude that is higher than that of the first output impedance state a predetermined amount of time following the switch of the digital output. In some embodiments, the plurality of memory cells includes a plurality of non-volatile memory cells. In some embodiments, the plurality of memory cells comprises an array of Flash memory cells. In some embodiments, the memory device further includes multipole semiconductor dies including the plurality of memory cells. In some embodiments, the switchable driver includes a pair of linear drivers operably coupled in parallel to the output. In some embodiments, the switchable driver includes a pair of non-linear drivers operably coupled in parallel to the output. In some embodiments, the predetermined amount of time following the switch of the digital output is about one third of a clock cycle of the digital output. In some embodiments, the clock cycle of the digital output is about two nanoseconds (2 ns).

In some embodiments, a driver circuit includes a first driver circuit having a first output impedance and a second driver circuit having a second output impedance having an amplitude that is less than an amplitude of the first output impedance. The output of the second driver circuit is operably coupled to an output of the first driver circuit. The driver circuit also includes a means for enabling and disabling the second driver circuit such that the second driver circuit is enabled when an output signal driven by the first driver circuit and the second output circuit switches between different logic levels (and is disabled while the output signal is maintained at a same logic level). The second driver circuit is disabled a delayed period of time following the switches in the output signal between the different logic levels. The driver circuit further includes a delay means for implementing the delayed period of time. In some embodiments, the output of the first driver and the output of the second driver are operably coupled to a memory line and are configured to deliver memory operation bias voltage potentials to a plurality of memory cells operably coupled to the memory line.

Figure 1:
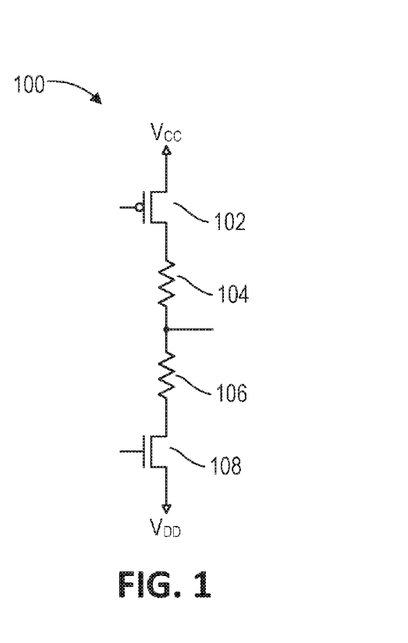
FIG. 1 is a schematic illustration of a linear driver.

FIG. 1 is a schematic illustration of a linear driver 100. The linear driver 100 includes a p-type metal oxide semiconductor (PMOS) pull-up transistor 102, a pull-up resistor 104, a pull-down resistor 106, and an n-type metal oxide semiconductor (NMOS) pull-down transistor 108 operably coupled in series. An output of the linear driver 100 is between the pull-up resistor 104 and the pull-down resistor 106. An input of the linear driver 100 is at gates of the pull-up transistor 102 and the pull-down transistor 108. The linear driver 100 includes a complementary metal oxide semiconductor (CMOS) inverter with the addition of the pull-up resistor 104 and the pull-down resistor 106.

The linear driver 100 has relatively constant resistance through swings in output voltage (e.g., swings between logic voltage levels). Accordingly, signal integrity at its output may tend to be relatively good. Also, the linear driver 100 has relatively high output resistance. Accordingly, reflections at direct current (DC) levels are relatively low compared to a non-linear driver 200, as will be discussed in more detail with reference to FIG. 2.

A relatively low output impedance version of the linear driver 100 can be used with on-die termination (ODT) to partially address the mismatch between the linear driver 100 and a high-impedance memory line. In such instances the pull-up resistor 104 and the pull-down resistor 106 may convert a portion of the reflections to heat, and reduce voltage swing (e.g., overshoot and undershoot). Thus configured, however, the linear driver 100 has limitations in driving high impedance lines in high capacity memory devices, especially for multi-die. Also, resistors (i.e., the pull-up resistor 104 and the pull-down resistor 106) occupy a relatively large area on a chip, and increase power expenditures, which is undesirable in memory devices. Furthermore, ODT causes high DC power consumption.

Figure 2:
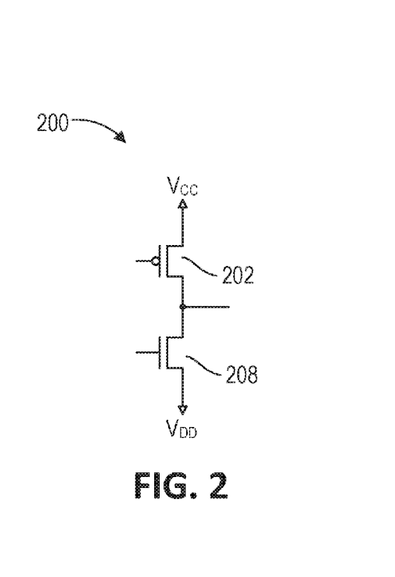
FIG. 2 is a schematic illustration of a non-linear driver.

FIG. 2 is a schematic illustration of a non-linear driver 200. The non-linear driver 200 includes a CMOS inverter. Specifically, the non-linear driver 200 includes a PMOS pull-up transistor 202 and an NMOS pull-down transistor 208, similar to the pull-up transistor 102 and the pull-down transistor 108 of the linear driver 100 of FIG. 1. The non-linear driver 200 does not, however, include resistors similar to the pull-up resistor 104 and the pull-down resistor 106 of the linear driver 100 of FIG. 1. Accordingly, the non-linear driver 200 may provide power and chip-area advantages over the linear driver 100 of FIG. 1. Furthermore, the non-linear driver 200 introduces lower capacitance than the linear driver 100 of FIG. 1.

Drain to source voltage of the pull-up transistor 202 and the pull-down transistor 208 of the non-linear driver 200 is less than drain to source voltage of the pull-up transistor 102 and the pull-down transistor 108 of the linear driver 100. Lower drain to source voltage leads to lower resistance values of the pull-up transistor 202 and the pull-down transistor 208, causing relatively more reflection than that of the non-linear driver 100 of FIG. 1. Also, variations in output resistance as output voltage changes between logic levels is greater for the non-linear driver 200 than for the linear driver 100 of FIG. 1. Accordingly, signal integrity at the output of the non-linear driver 200 may be poorer than that for the linear driver 100 of FIG. 1.

One way to prevent reflections and overshoot is to design the driver 100 or 200 to have an output impedance that matches the channel characteristic impedance of the memory line. In high capacity memory devices, however, the channel characteristic impedance is relatively large (e.g., about 50 ohms). With an output impedance as large as a complex conjugate of a relatively large characteristic impedance of the memory line, the driver 100 or 200 drives relatively weakly, and therefore may not meet high data rates. Decreasing the output impedance of the driver 100 or 200 increases the driving capability, but also increases reflections. Embodiments disclosed herein include drivers 300 (FIG. 3) that leverage the driving capability of a low-impedance driver 100 or 200 together with the good impedance match characteristics of a high-impedance driver 100 or 200. Although these embodiments are discussed in context of switchable impedance drivers driving a memory line in a memory device, the disclosure is not so limited. Embodiments of the disclosure extend also to any device where switchable impedance drivers may be helpful or desirable.

In some embodiments, a driver includes an input configured to receive a digital data input to the driver, and an output configured to operably couple to one or more loads and deliver a digital data output from the driver to the one or more loads. The driver also includes a first sub-driver operably coupled between the input and the output and having a first output impedance. The driver further includes a second sub-driver operably coupled to the output in parallel with the first sub-driver, the second sub driver having a second output impedance that is lower than the first output impedance when the second sub-driver is enabled to drive the output, and higher than the first output impedance when the second sub-driver is disabled from driving the output. The driver also includes logic circuitry operably coupled to the input, the output, and the second sub-driver. The logic circuitry is configured to enable the second sub-driver to drive the output during switching of the digital data output between different logic levels (e.g., during a "switching" period). The logic circuitry may be configured to disable the second sub-driver from driving the output when the output is not switching between different logic levels and/or while the output is maintained at a particular logic level or is within a threshold of the particular logic level (e.g., during a "non-switching" period).

In some embodiments, a method includes delivering a digital data input to a first sub-driver and logic circuitry for controlling a second sub-driver operably coupled to an output of the driver in parallel with an output of the first sub-driver. The method also includes driving a digital data output to the output with both the first sub-driver and the second sub-driver when the digital data input switches between logic levels. The method further includes disabling the second sub-driver when the digital data output reaches a desired logic level following the switch between logic levels of the digital data input. The method also includes driving the digital data output to the output with only the first sub-driver and not the second sub-driver while the second sub-driver is disabled.

In some embodiments, a memory device comprises an array of memory cells, and an electrical line operably coupled to a portion of the memory cells of the array. The memory device also includes a switchable driver including an output operably coupled to the electrical line. The switchable driver is configured to drive the electrical line with a digital output, operate in a low output impedance state during a switch of the digital output between different logic levels, and operate in a high output impedance state a predetermined amount of time following the switch of the digital output.

As used herein, the term "digital," when used with reference to electrical signals (e.g., "digital signal," "digital input," "digital output," "digital data input," "digital data output," etc.) refers to electrical signals that correspond to two or more logic levels (e.g., a logic level high, a logic level low, intervening logic levels, etc.). A digital signal may comprise an analog electrical signal that is configured for quantization into one or more discrete values (e.g., logic levels). As used herein a "logic level" refers to a quantized electrical signal (e.g., a quantized analog signal). Logic levels may be delineated into ranges, such as ranges of voltage levels, ranges of voltage potential levels, and/or the like. The ranges of respective logic levels may be separated (e.g., may correspond to and/or be separated by one or more thresholds). In some embodiments, the thresholds between logic levels are fixed regardless of whether the analog of the electrical signal is approaching or departing from a given logic level. Alternatively, thresholds of the logic levels may vary depending on whether the analog of the electrical signal(s) is approaching or departing given logic levels (e.g., Schmitt triggering). In some embodiments, thresholds between logic levels may vary based on electrical characteristics associated with the electrical signals (e.g., the digital input and/or output signals), such as characteristics of a load associated with the electrical signals (e.g., a load coupled to the digital data output), characteristics of signal line(s), characteristics of bit line(s), characteristics of word line(s), and so on. The characteristics associated with the electrical signals may include, but are not limited to: resistance, capacitance, impedance, parasitics, charge leakage, charge coupling, and/or the like.

Figure 3:
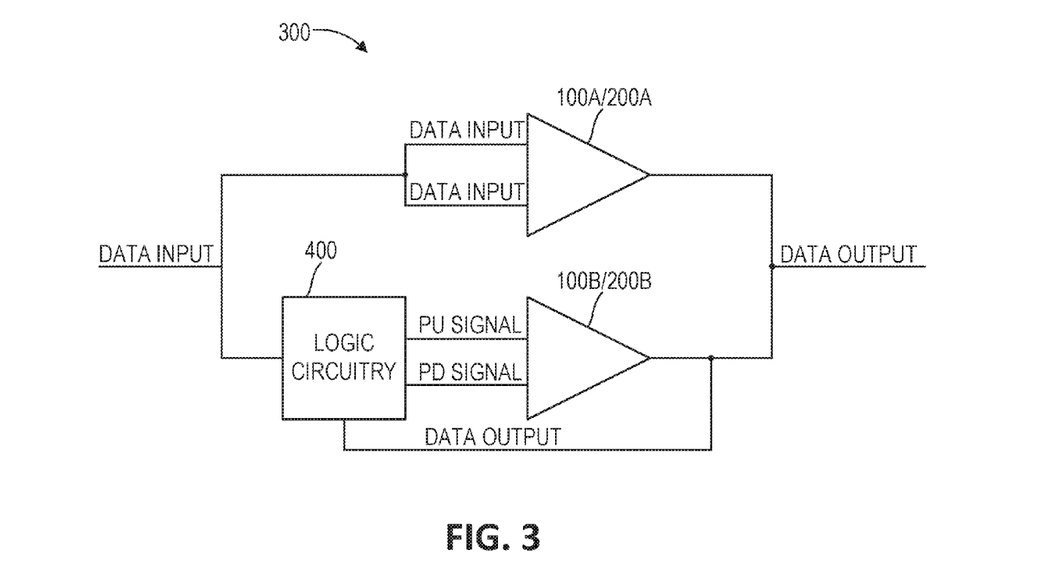
FIG. 3 is a simplified schematic illustration of a switchable impedance driver, according to some embodiments.

FIG. 3 is a simplified schematic illustration of a switchable impedance driver 300, according to some embodiments. The switchable impedance driver 300 is configured to drive a digital data output DATA OUTPUT with relatively low output impedance when switching DATA OUTPUT between logic levels, and with relatively high output impedance when DATA OUTPUT has settled to a logic level following a switch between logic levels. As used herein, the terms "low," "large," "high," and other relative terms used in conjunction with the term "impedance" refer to a magnitude of the impedance, taking into consideration both real (resistive) and imaginary (reactive) components of impedance.

The switchable impedance driver 300 includes a first sub-driver 100A/200A, a second sub-driver 100B/200B, and logic circuitry 400 configured to selectively enable and disable the second sub-driver 100B/200B. In some embodiments, the first sub-driver 100A/200A and the second sub-driver 100B/200B each include one of a linear driver 100 (FIG. 1) or a non-linear driver 200 (FIG. 2). The first sub-driver 100A/200A is operably coupled between an input of the switchable impedance driver 300 and an output of the switchable impedance driver 300. Accordingly, the first sub-driver 100A/200A is configured to receive a digital data input DATA INPUT and drive the DATA OUTPUT.

The first sub-driver 100A/200A has a relatively high output impedance compared to an output impedance of the second sub-driver 100B/200B, when enabled. For example, an output impedance of the first sub-driver 100A/200A may be selected to be an impedance match to an impedance of the output of the switchable impedance driver (e.g., an output of a transmission line coupled to the output and any loads coupled thereto).

When enabled, the second sub-driver 100B/200B has a relatively low output impedance compared to the output impedance of the first sub-driver 100A/200A. Accordingly, the driving capability of the enabled second sub-driver 100B/200B may be superior to the driving capability of the first sub-driver 100A/200A.

The first sub-driver 100A/200A and the second sub-driver 100B/200B are operably coupled in parallel to the same output of the switchable impedance driver 300. Accordingly, the output impedance of the switchable impedance driver 300 may be the parallel combination of the output impedance of the first sub-driver 100A/200A with the output impedance of the second sub-driver 100B/200B. When disabled, the second sub-driver 100B/200B has a high output impedance. In some embodiments, the output impedance of the second sub-driver 100B/200B may be effectively an open circuit by comparison to the output impedance of the first sub-driver 100A/200A. As a result, when the logic circuitry 400 disables the second sub-driver 100B/200B, the switchable impedance driver 300 has a relatively high output impedance, similar to that of the first sub-driver 100A/200A. Thus, when the second sub-driver 100B/200B is disabled, the switchable impedance driver 300 may be functioning in a high output impedance state. In the high output impedance state, the switchable impedance driver 300 may have relatively limited driving capability, but may have relatively little reflections, overshoot, and undershoot.

When the second sub-driver 100B/200B is enabled, the output impedance of the switchable impedance driver 300 decreases. Accordingly, when the second sub-driver 100B/200B is enabled, the switchable impedance driver 300 may be functioning in a low output impedance state. In the low output impedance state, the switchable impedance driver 300 may have improved driving capability compared to that of the high output impedance state. Reflections, overshoot, and undershoot, however, potentially increase as compared to the same parameters during the high output impedance state.

In some embodiments, the logic circuitry 400 is operably coupled between the output of the switchable impedance driver 300 and inputs of the second sub-driver 100B/200B, and between the input of the switchable impedance driver 300 and the inputs of the second sub-driver 100B/200B. The logic circuitry 400 may be configured to enable and disable the second sub-driver 100B/200B using a pull-up signal PU SIGNAL and a pull-down signal PD SIGNAL. The PU SIGNAL and the PD SIGNAL may be applied to a pull-up transistor (e.g., pull-up transistor 102 or 202 of FIG. 1 or 2) and a pull-down transistor (e.g., pull-down transistor 108 or 208 of FIG. 1 or 2) of the second sub-driver 100B/200B, respectively. One non-limiting example of the logic circuitry 400 is illustrated in FIG. 4.

The logic circuitry 400 is configured to selectively enable and disable the second sub-driver 100B/200B, effectively switching the switchable impedance driver 300 between the low output impedance state and the high output impedance state, respectively. Specifically, the logic circuitry 400 may be configured to enable the second sub-driver 100B/200B during a time period when the DATA OUTPUT is switching from one logic level to another (e.g., from a logic level high to a logic level low, or vice versa).

Once the DATA OUTPUT arrives at or near a logic level (e.g., settles at the logic level) following a switch, the logic circuitry 400 is configured to disable the second sub-driver 100B/200B. Accordingly, the switchable impedance driver 300 takes advantage of the high driving capabilities of the second sub-driver 100B/200B during voltage transitions of DATA OUTPUT between logic levels, and of the better reflection, overshoot, and undershoot characteristics of the first sub-driver 100A/200A while the DATA OUTPUT is at stable levels. As a result, embodiments disclosed herein benefit from the strengths of both high impedance drivers and low impedance drivers, while reducing or avoiding the weaknesses thereof.

Figure 4:
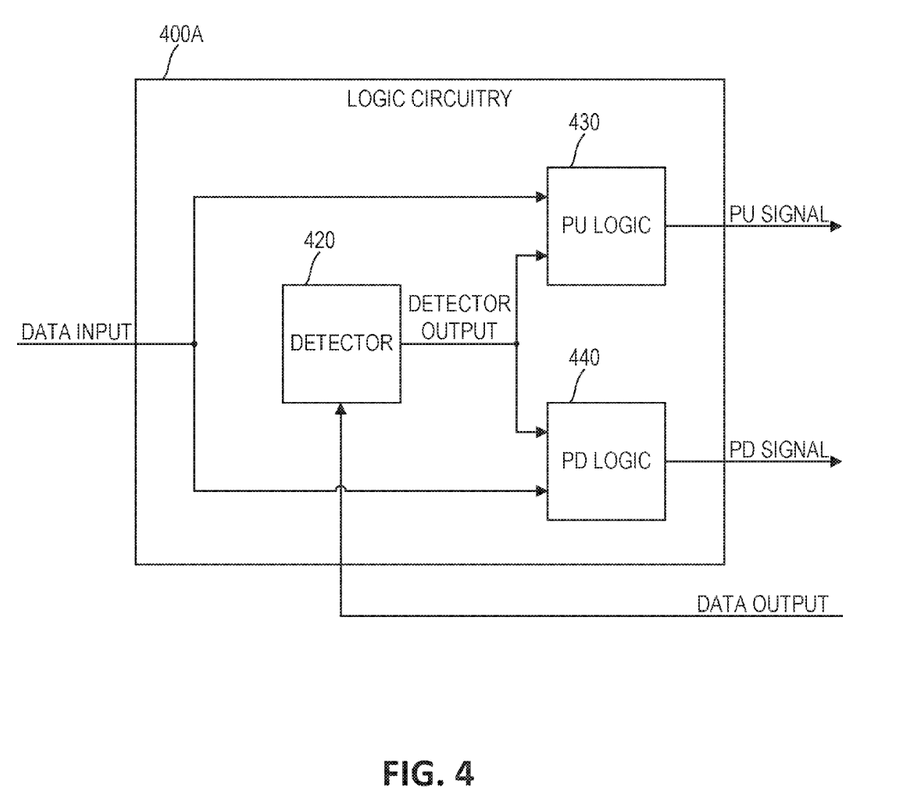
FIG. 4 is a simplified non-limiting example of logic circuitry that may be used in the switchable impedance driver of FIG. 3.

FIG. 4 is a simplified non-limiting example of logic circuitry 400A that may be used in the switchable impedance driver 300 of FIG. 3. Referring to FIGS. 3 and 4 together, the logic circuitry 400A includes a detector 420, pull-up logic 430 (PU logic 430), and pull-down logic 440 (PD logic 440). The detector 420 is configured to detect when the DATA OUTPUT switches between different logic levels, and generate a signal DETECTOR OUTPUT configured to control the PU logic 430 and the PD logic 440 to activate and deactivate the second sub-driver 100B/200B at appropriate times.

The PU logic 430 is configured to receive the DATA INPUT signal and the DETECTOR OUTPUT signal, and generate a pull-up signal PU SIGNAL that is configured to control pull-up circuitry of the second sub-driver 100B/ 200B. Similarly, the PD logic 440 is configured to receive the DATA INPUT signal and the DETECTOR OUTPUT signal, and generate a pull-down signal PD SIGNAL that is configured to control pull-down circuitry of the second sub-driver 100B/200B.

In some embodiments, the DETECTOR OUTPUT may comprise a delayed version of DATA INPUT. Accordingly, in embodiments where the first sub-driver 100A/200A and the second sub-driver 100B/200B are implemented as CMOS inverters, the detector 420 may include some form of inverter that inverts DATA OUTPUT, which is itself a delayed and inverted version of the DATA INPUT. By way of non-limiting example, the detector 420 may include a single inverter (e.g., a CMOS inverter). Also by way of non-limiting example, the detector 420 may include an odd number of inverters connected in series with the odd number selected to introduce a desired amount of delay between DATA OUTPUT and DETECTOR OUTPUT. In some embodiments, the detector 420 may include other delay elements or delay circuits. By way of non-limiting example, the detector 420 may include a clocked series of flip-flops, or a logic circuit including logic gates (e.g., AND, OR, NAND, NOR, XOR, other logic gates, or combinations thereof) arranged in a delay-generating configuration.

It should be noted that, since the DETECTOR OUTPUT is merely a delayed version of the DATA INPUT, the detector 420 may instead be implemented as a delay circuit receiving the DATA INPUT (instead of reading the DATA OUTPUT fed back to the detector 420), and providing the DETECTOR OUTPUT to the PU logic 430 and the PD logic 440. With the DATA OUTPUT fed back to the detector 420, however, as shown in FIG. 4, it can be assured that disablement of the second sub-driver 100B/200B is responsive to switching in the output of the switchable impedance driver 300 (FIG. 3). The PD logic 440 may, therefore, be configured to disable the second sub-driver 100B/200B while the DATA OUTPUT is maintained at a particular logic level (e.g., maintained within thresholds of the particular logic level).

A truth table illustrating possible operation of the PU logic 430 and the PD logic 440 is as follows:

| DATA INPUT | 0 | 1 | 0 | 1 |
|---|---|---|---|---|
| DETECTOR OUTPUT | 1 | 1 | 0 | 0 |
| PU SIGNAL | 0 | 1 | 1 | 1 |
| PD SIGNAL | 0 | 0 | 0 | 1 |

To achieve this functionality, the PU logic 430 may include an "or" gate having a first input operably coupled to the DATA INPUT and a second input coupled to an inverse of the DETECTOR OUTPUT (e.g., an inverter coupled between the DETECTOR OUTPUT and the second input of the "or" gate). Accordingly, the PU SIGNAL would only be driven to a logic level low (e.g., "0"), which would activate the pull-up circuitry of the second sub-driver 100B/200B, responsive to the DATA INPUT being low and the DETECTOR OUTPUT being high. Similarly, the PD logic 440 may include an "and" gate having a first input that receives an inverse of the DETECTOR OUTPUT (e.g., an inverter coupled between the DETECTOR OUTPUT and the first input of the "and" gate) and a second input coupled to the DATA INPUT. As a result, the PD SIGNAL would only be driven to a logic level high (e.g., "1"), which would activate the pull-down circuitry of the second sub-driver 100B/200B, responsive to the DATA INPUT being high and the DETEC- TOR OUTPUT being low. More detail as to the signals DATA INPUT, DATA OUTPUT, DETECTOR OUTPUT, PU SIGNAL, and PD SIGNAL will be discussed below with reference to FIG. 7.

Figure 5:
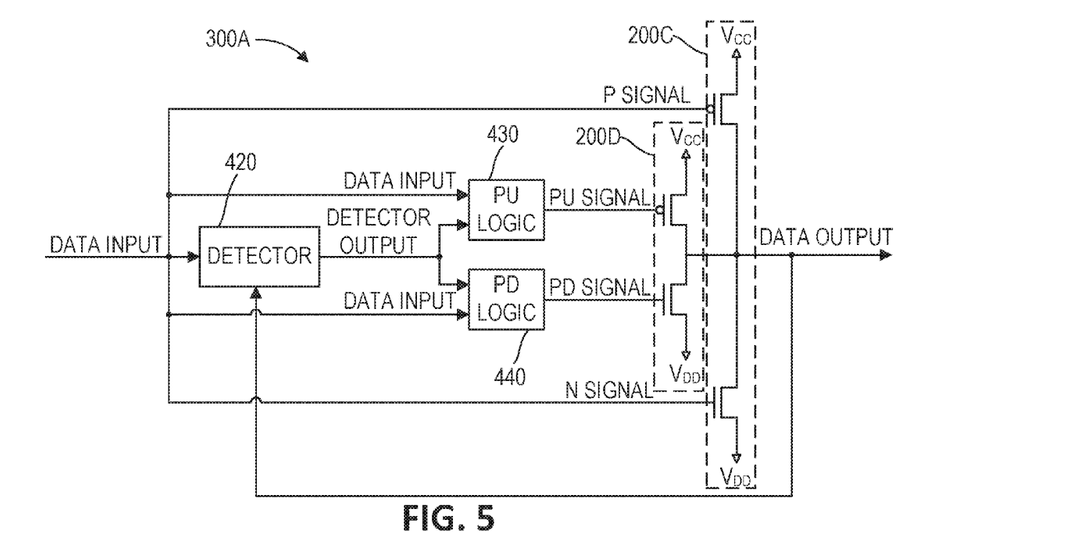
FIG. 5 is a simplified non-limiting example of a switchable impedance driver implemented using the non-linear driver of FIG. 2, according to some embodiments.

FIG. 5 is a simplified non-limiting example of a switchable impedance driver 300A implemented using the non-linear driver 200 of FIG. 2, according to some embodiments. The switchable impedance driver 300A includes the detector 420, the PU logic 430, and the PD logic 440 discussed with reference to FIG. 4. The switchable impedance driver 300A also includes a first sub-driver 200C and a second sub-driver 200D. The first sub-driver 200C and the second sub-driver 200D include non-linear drivers, similar to the non-linear driver 200 of FIG. 2. Delayed versions of the DATA INPUT, namely P SIGNAL and N SIGNAL, drive the pull-up circuitry and the pull-down circuitry of the first sub-driver 200C. The first sub-driver 200C is configured to have an output impedance that is relatively close to an impedance match of the output of the switchable impedance driver 300A. In other words, the output impedance of the first sub-driver 300C is about equal to a complex conjugate of an output line and any loads attached thereto of the output of the switchable impedance driver 300A. The output impedance of the second sub-driver 200D, however, is relatively low compared to the output impedance of the first sub-driver 200C to enable the switchable impedance driver 300A to provide relatively high current when the second sub-driver 200D is enabled.

Figure 6:
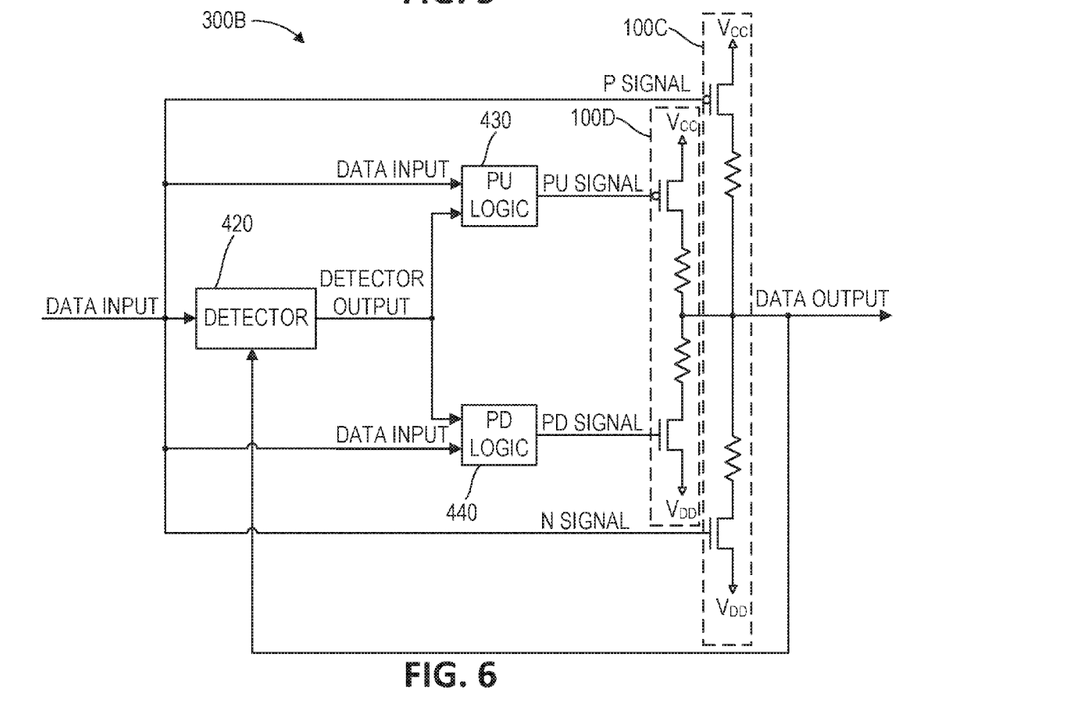
FIG. 6 is a simplified non-limiting example of a switchable impedance driver implemented using the linear driver of FIG. 1, according to some embodiments.

FIG. 6 is a simplified non-limiting example of a switchable impedance driver 300B implemented using the linear driver 100 of FIG. 1, according to some embodiments. The switchable impedance driver 300B includes the detector 420, the PU logic 430, and the PD logic 440 discussed with reference to FIG. 4. The switchable impedance driver 300B also includes a first sub-driver 100C and a second sub-driver 100D. The first sub-driver 100C and the second sub-driver 100D include linear drivers, similar to the linear driver 100 of FIG. 1. The switchable impedance driver 300B of FIG. 6 is similar to the switchable impedance driver 300A of FIG. 5 except for the use of linear sub-drivers 100C, 100D instead of non-linear sub-drivers 200C, 200D.

Figure 7:
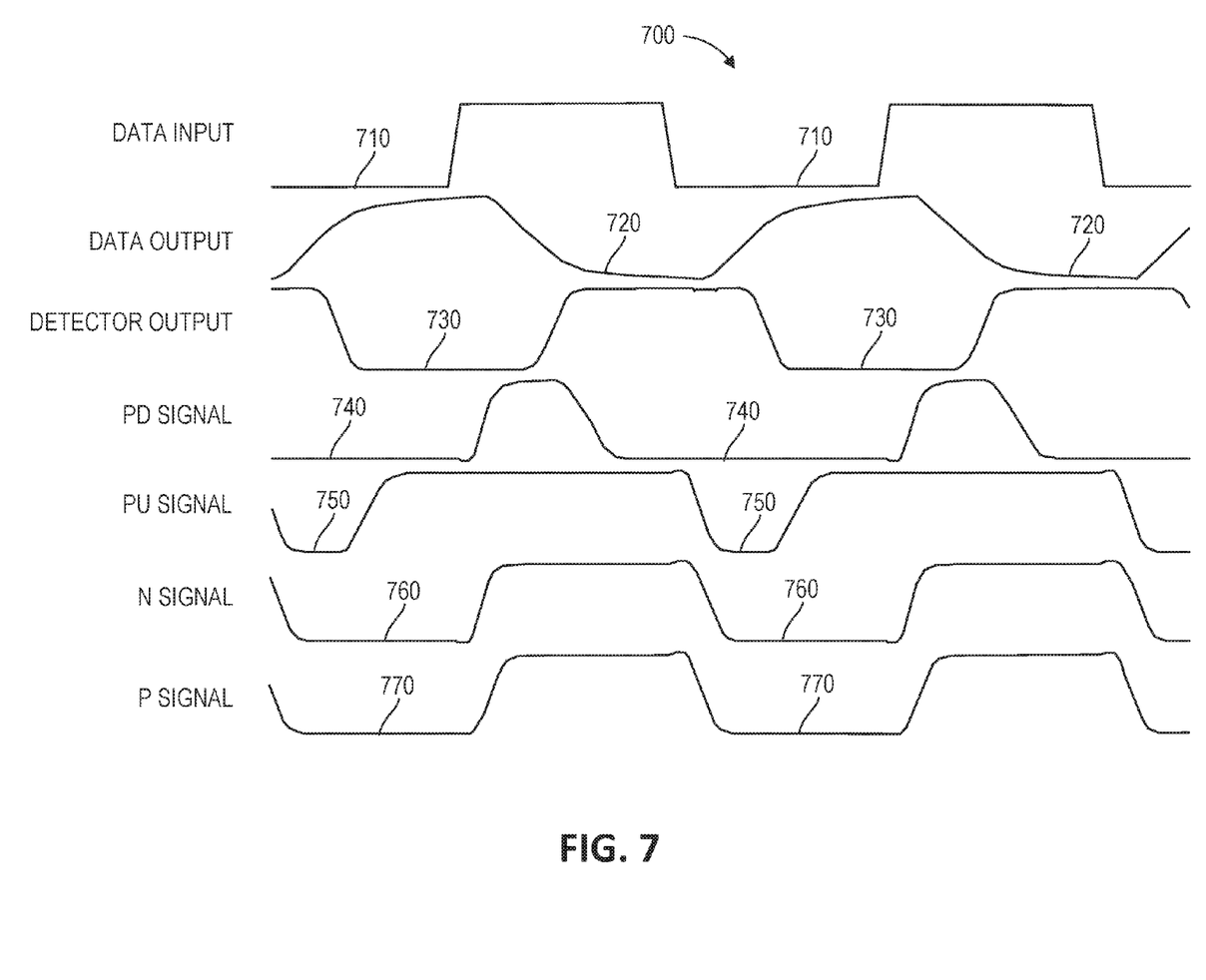
FIG. 7 is a simplified illustration of waveforms of different voltage potentials resulting from the switchable impedance driver of FIG. 5.

FIG. 7 is a simplified illustration of waveforms 700 of different voltage potentials 710, 720, 730, 740, 750, 760, and 770 resulting from the switchable impedance driver 300A of FIG. 5. Specifically, the waveforms 700 include the DATA INPUT 710, the DATA OUTPUT 720, the DETECTOR OUTPUT 730, the PD SIGNAL 740, the PU SIGNAL 750, the N SIGNAL 760, and the P SIGNAL 770, as illustrated in FIG. 5. Referring to FIGS. 5 and 7 together, the N SIGNAL 760 and the P SIGNAL 770 keep the first sub-driver 200C enabled as long as the DATA INPUT 710 is applied to the input of the switchable impedance driver 300A.

As illustrated in FIG. 7, a delayed period of time after the DATA INPUT 710 switches from low to high (e.g., from a logic "0" to a logic "1"), the DATA OUTPUT 720 starts to switch from a high to a low. The DETECTOR OUTPUT 730, in turn, switches from a low to a high a delayed period of time following the switch of the DATA OUTPUT 720 from the high to the low. The PD SIGNAL 740 switches from a low to a high responsive to the DATA INPUT 710 switching from the low to the high, but then switches back to a low responsive to the DETECTOR OUTPUT 730 switching from the low to the high. As a result, while the DATA OUTPUT 720 is switching from the high to the low, the PD SIGNAL 740 drives the pull-down portion of the second sub-driver 200D to drive the DATA OUTPUT 720 to the low in the low output impedance state. When the DETECTOR OUTPUT 730 switches to the logic level high, however, the PD SIGNAL 740 switches to a logic level low, disabling the pull-down portion of the second sub-driver 200D, leaving the first sub-driver 200C to drive the DATA OUTPUT 720 alone in the high output impedance state. The PU SIGNAL 750 may remain in a logic high throughout these operations, maintaining the pull-up portion of the second sub-driver 200D in a disabled state.

A delayed period of time after the DATA INPUT 710 switches from a high to a low, (e.g., from a logic "1" to a logic "0"), the DATA OUTPUT 720 starts to switch from a low to a high. The DETECTOR OUTPUT 730, in turn, switches from a high to a low a delayed period of time following the switch of the DATA OUTPUT 720 from the low to the high. The PU SIGNAL 750 switches from a high to a low responsive to the DATA INPUT 710 switching from the high to the low, but then switches back to a high responsive to the DETECTOR OUTPUT 730 switching from the high to the low. As a result, while the DATA OUTPUT 720 is switching from the low to the high, the PU SIGNAL 750 drives the pull-up portion of the second sub-driver 200D to drive the DATA OUTPUT 720 to the high in the low output impedance state. When the DETECTOR OUTPUT 730 switches to the logic level low, however, the PU SIGNAL 750 switches to the high, disabling the pull-up portion of the second sub-driver, and leaving the first sub-driver 200C to drive the DATA OUTPUT 720 alone in the high output impedance state. The PD SIGNAL 740 may remain in a logic level low through these operations.

Similar waveforms to the waveforms 700 of FIG. 7 would result from the switchable impedance driver 300B of FIG. 6.

Figure 8:
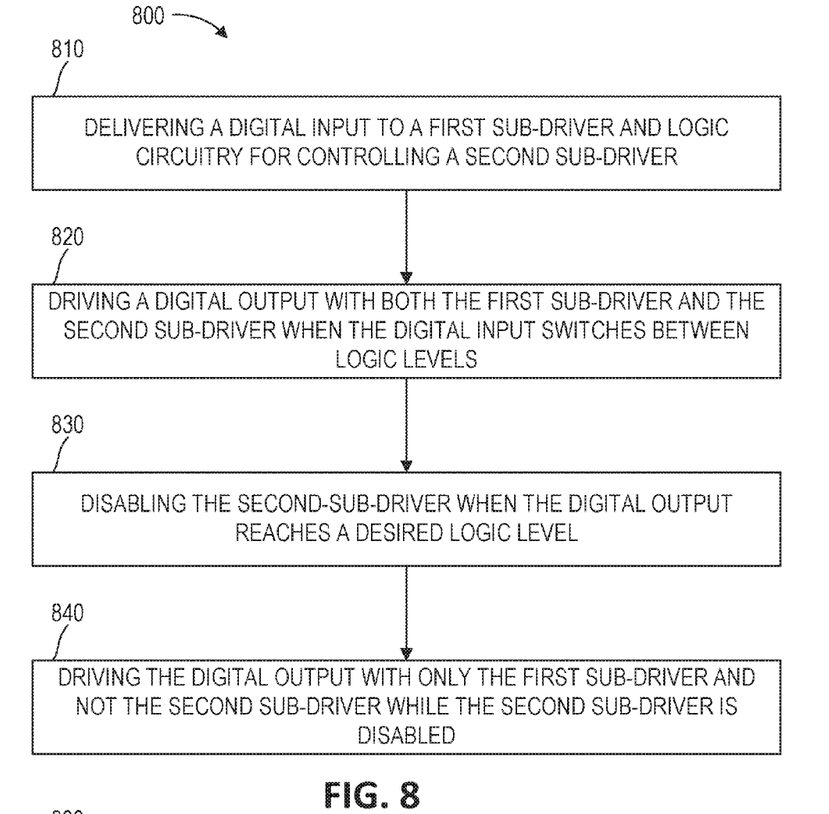
FIG. 8 is a simplified flowchart illustrating a method of operating a switchable impedance driver, according to some embodiments.

FIG. 8 is a simplified flowchart illustrating a method 800 of operating a switchable impedance driver 300, according to some embodiments. Referring to FIGS. 3 and 8 together, the method 800 includes delivering 810 a digital data input DATA INPUT to a first sub-driver 100A/200A and logic circuitry 400 for controlling a second sub-driver 100B/200B operably coupled to an output of the switchable impedance driver 300 in parallel with and output of the first sub-driver 100A/200A.

The method 800 also includes driving 820 a digital data output DATA OUTPUT to the output of the switchable impedance driver 300 with both the first sub-driver 100A/200A and the second sub-driver 100B/200B when the digital data input DATA INPUT switches between logic levels. In some embodiments, driving 820 a digital data output DATA OUTPUT to the output includes driving a voltage bias for a memory operation (e.g., a read, a write, an erase, etc.). In some embodiments, driving 820 the digital data output DATA OUTPUT includes driving the digital data output DATA OUTPUT while a magnitude of an output impedance of the driver is less than a magnitude of a complex conjugate of an impedance of the output (e.g., at least less than about fifty percent of the magnitude of the complex conjugate of the impedance of the output).

The method 800 further includes disabling 830 the second sub-driver 100B/200B when the digital data output DATA OUTPUT reaches a desired logic level following the switch between logic levels of the digital data input DATA INPUT.

In addition, the method 800 includes driving 840 the digital data output DATA OUTPUT to the output with only the first sub-driver 100A/200A and not the second sub-driver 100B/200B while the second sub-driver 100B/200B is disabled. In some embodiments, driving 840 the digital data output DATA OUTPUT to the output with only the first sub-driver 100A/200A comprises driving the digital data output DATA OUTPUT while an output impedance of the switchable impedance driver 300 matches an impedance of the output.

Figure 9:
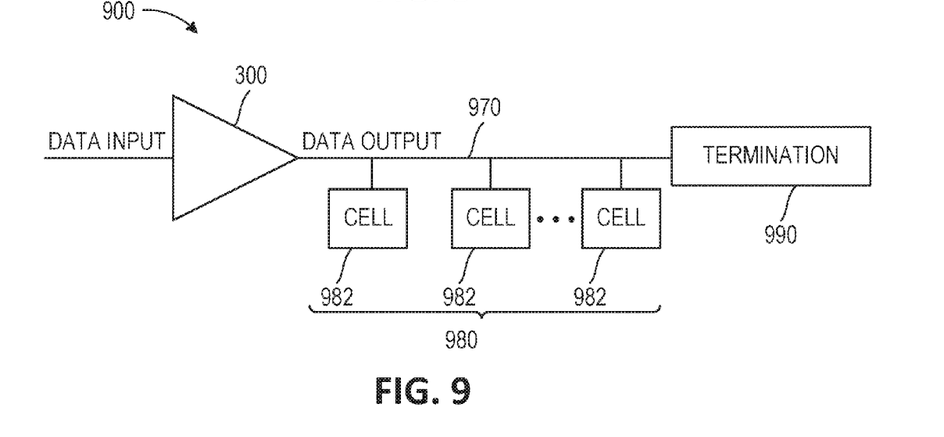
FIG. 9 is a simplified block diagram of a memory device, according to some embodiments.

FIG. 9 is a simplified block diagram of a memory device 900, according to some embodiments. The memory device 900 includes the switchable impedance driver 300 of FIG. 3 (e.g., the switchable impedance driver 300A of FIG. 5, the switchable impedance driver 300B of FIG. 6, other switchable impedance driver, etc.), a memory line 970 (e.g., a bit line, a word line etc.), and an array 980 of memory cells 982. The output of the switchable impedance driver 300 is operably coupled to the memory line 970. The memory line 970 is operably coupled to at least a portion of the cells 982 of the array 980, and is terminated with a termination 990 (e.g., an open circuit termination).

The switchable impedance driver 300 is configured to receive a memory signal DATA INPUT and drive a memory output DATA OUTPUT to the memory line 970. The memory line 970 is configured to deliver the DATA OUTPUT to the cells 982 of the array 980 that are operably coupled thereto.

In operation, when the DATA OUTPUT switches between logic levels, the switchable impedance driver 300 operates in a low output impedance state. In the low output impedance state, the output impedance of the switchable impedance driver 300 may be relatively low compared to that of a high output impedance state of the switchable impedance driver 300. A predetermined amount of time after a switch between logic levels of the DATA OUTPUT, the switchable impedance driver 300 may be configured to operate in the high output impedance state.

In some embodiments, the output impedance of the switchable impedance driver 300 in the high output impedance state may be about equal to the complex conjugate of the impedance of the memory line 970 and the attached loads (i.e., the cells 982 and the termination 990). By way of non-limiting example, the termination 990 may be an open-circuit termination. As a result, the impedance of the memory line 970 and its attached loads may be highly capacitive (i.e., due to the cells 982). Accordingly, the output impedance of the switchable impedance driver 300 in the high impedance state may be about equal to the complex conjugate of the highly capacitive impedance of the memory line 970 and its attached loads (e.g., the cells 982).

In some embodiments, the array 980 of memory cells 982 includes an array of non-volatile memory cells (e.g., Flash memory cells, phase change memory cells, ferroelectric memory cells, etc.). In some embodiments, the memory device 900 includes multiple semiconductor dies (not shown in FIG. 9 to avoid obscuring the details of the depicted embodiments). Each semiconductor die may comprise one or more memory cells 982 (e.g., portions of the array 980 of memory cells 982 may be embodied within respective semiconductor die). In some embodiments, the memory line 970 may span two or more of the semiconductor die (two or more of the memory cells 982 may be embodied within different semiconductor die). In some embodiments, the switchable impedance driver 300 includes a pair of linear drivers 100 (FIG. 1) operably coupled in parallel to the output of the switchable impedance driver 300. In some embodiments, the switchable impedance driver 300 includes a pair of non-linear drivers 200 operably coupled in parallel to the output of the switchable impedance driver 300.

Figure 10:
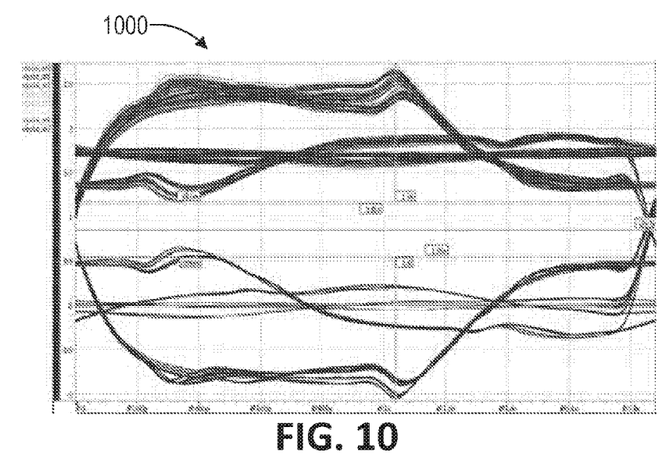
FIG. 10 is a simplified eye diagram of an output of a non-switchable, non-linear driver in a memory device.
Figure 11:
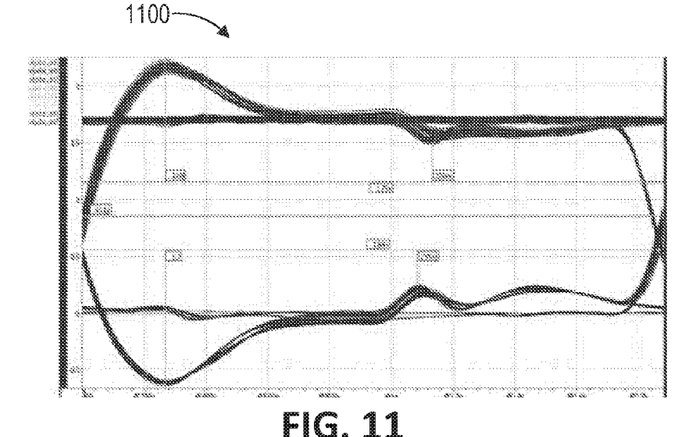
FIG. 11 is a simplified eye diagram of the output of the switchable impedance driver of FIG. 9 in the memory device.

The switchable impedance driver 300 of FIG. 9 may perform better than a driver 100 or 200 that is not switchable, as illustrated in FIGS. 10 and 11.

FIG. 10 is a simplified eye diagram 1000 of an output of a non-switchable non-linear driver 200 in a memory device. As can be seen in the eye diagram 1000, the output of the non-linear driver 200 is plagued by reflections and undershoot, and does not achieve fast output swing, as compared to the eye diagram 1100 of FIG. 11.

FIG. 11 is a simplified eye diagram 1100 of the output of the switchable impedance driver 300 of FIG. 9 in the memory device 900. As can be seen in the eye diagram 1100, the output of the switchable impedance driver achieves relatively fast swing between logic levels, and does not suffer from as many reflections, overshoot, or undershoot as compared to the eye diagram 1000 of FIG. 10.

Figure 12:
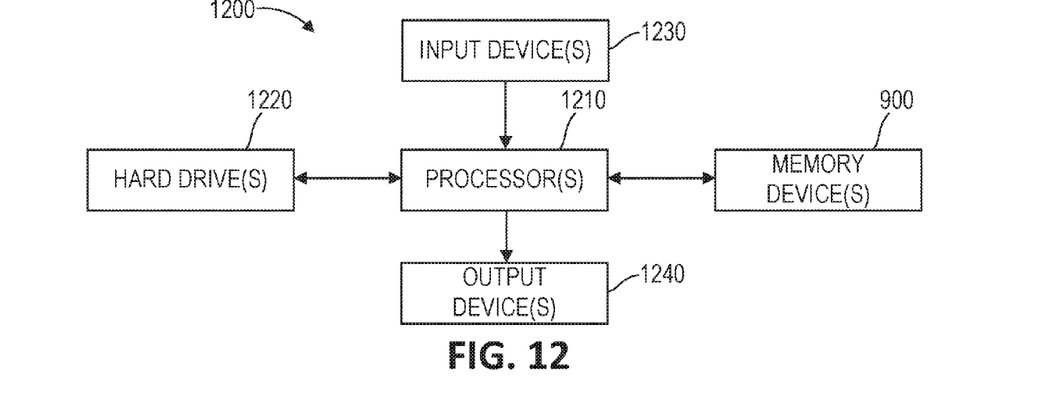
FIG. 12 is a simplified block diagram of a computing device, according to some embodiments.

FIG. 12 is a simplified block diagram of a computing device 1200, according to some embodiments. The computing device 1200 includes at least one processor 1210 operably coupled to at least one memory device 900. The at least one memory device 900 may be as discussed with reference to FIG. 9. The computing device 1200 also includes a hard drive 1220, an input device 1230 (e.g., a keyboard, a mouse, a track pad, a joy stick, a pointing device, a touchscreen input, an audio input, other input devices, or combinations thereof), and an output device 1240 (e.g., an electronic display, a touchscreen display, an audio speaker, a haptic output device, etc.). The hard drive 1220 may be configured to store computer-readable instructions configured to instruct the at least one processor to execute operations of the computing device 1200. The at least one processor 1210 may be configured to transfer the computer-readable instructions from the hard drive 1220 to the at least one memory device 900 for execution.

It will be apparent to those having skill in the art that changes may be made to the details of the above-described embodiments without departing from the underlying principles of the disclosure. The scope of the disclosure should, therefore, be determined only by the following claims.

The invention claimed is:

1. A method, comprising:
   receiving a digital data input at a driver comprising a first sub-driver and logic circuitry for controlling a second sub-driver operably coupled to an output of the driver in parallel with an output of the first sub-driver; and
   in response to the received digital data input switching from a first logic level to a second logic level:
      activating the second sub-driver while switching the output of the driver to the second logic level, such that the output of the driver is driven up towards the second logic level by use of both the first sub-driver and the second sub-driver during the switching; and
      disabling the second sub-driver in response to switching the output of the driver to the second logic level, such that the output of the driver is maintained at the second logic level by use of the first sub-driver and not the second sub-driver.

2. The method of claim 1, wherein disabling the second sub-driver comprises driving the output of the driver at the second logic level while an output impedance of the driver matches an impedance of a load coupled to the output of the driver.

3. The method of claim 1, further comprising driving a voltage bias for a memory operation to the output of the driver.

4. The method of claim 1, wherein activating the second sub-driver comprises driving the output of the driver such that a magnitude of an output impedance of the driver is less than a magnitude of an impedance of a load coupled to the output of the driver.

5. The method of claim 4, wherein the magnitude of the output impedance of the driver is less than the magnitude of the impedance of the load by at least about fifty percent (50%).

6. A circuit, comprising:
a first driver operably coupled to an output of the circuit, the first driver configured to drive the output of the circuit and having a first output impedance; and
logic circuitry coupled to a second driver operably coupled to the output of the circuit in parallel with the first driver, the logic circuitry configured to:
enable the second driver to drive the output of the circuit in parallel with the first driver while transitioning the output of the circuit between different logic levels, and
disable the second driver after the transitioning;
wherein an output impedance of the second driver is lower than an output impedance of the first driver.

7. The circuit of claim 6, wherein:
the output of the circuit is operably coupled to a memory line, and
the memory line is operably coupled to a plurality of memory cells.

8. The circuit of claim 6, wherein:
the first driver comprises a first Complementary Metal-Oxide-Semiconductor (CMOS) inverter, and
the second driver comprises a second CMOS inverter.

9. The circuit of claim 6, wherein each of the first driver and the second driver comprises:
a pull-up transistor;
a pull-up resistor;
a pull-down resistor;
a pull-down transistor; and
a sub-output,
wherein the pull-up transistor, the pull-up resistor, the pull-down resistor, and the pull-down transistor are coupled in series and the sub-output is operably coupled between the pull-up resistor and the pull-down resistor.

10. The circuit of claim 6, wherein the first output impedance is configured to match an impedance of a load, the load comprising one or more of a far-end open circuit and a primarily capacitive load.

11. The circuit of claim 6, wherein the logic circuitry is configured to disable the second driver while the output of the circuit is maintained at a particular logic level by the first driver.

12. The circuit of claim 6, wherein:
the second driver comprises:
a pull-up transistor, and
a pull-down transistor; and
the logic circuitry comprises:
pull-up logic operably coupled to a gate of the pull-up transistor,
pull-down logic operably coupled to a gate of the pull-down transistor, and
detector logic operably coupled to the output of the circuit and each of the pull-up logic and the pull-down logic, the detector logic configured to:
detect a transition of the output of the circuit from a first logic level to a second logic level,
enable the second driver to drive the output of the circuit in parallel with the first driver in response to the detecting by use of one or more of the pull-up logic and the pull-down logic, and
disable the second driver after a predetermined time period following the detecting by use of one or more of the pull-up logic and the pull-down logic.

13. A memory device, comprising:
an electrical line operably coupled to one or more memory cells; and
a switchable driver comprising an output operably coupled to the electrical line, the switchable driver configured to:
drive the electrical line with a digital output corresponding to a plurality of logic levels;
operate at a first output impedance while switching the digital output between different logic levels of the plurality of logic levels; and
operate at a second output impedance while maintaining the digital output at a particular logic level of the plurality of logic levels, wherein:
the second output impedance is higher than the first output impedance, and
the second output impedance of the switchable driver has substantially a same magnitude while the switchable driver maintains the digital output at each of two or more different logic levels of the plurality of logic levels.

14. The memory device of claim 13, wherein the one or more memory cells comprise one or more of: non-volatile memory cells, solid-state memory cells, and Flash memory cells embodied within an array of Flash memory cells.

15. The memory device of claim 13, wherein the electrical line is operably coupled to a first memory cell embodied within a first semiconductor die and a second memory cell embodied within a second semiconductor die, different from the first semiconductor die.

16. The memory device of claim 13, wherein:
the switchable driver further comprises a first sub-driver and a second sub-driver operably coupled in parallel to the output of the switchable driver.

17. The memory device of claim 16, wherein:
the second sub-driver comprises one or more of a linear driver and a non-linear drivers;
the switchable driver is further configured to:
operate at the first output impedance by enabling the second sub-driver to drive the output of the switchable driver in parallel with the first sub-driver, and
operate at the second output impedance by disabling the second sub-driver.

18. The memory device of claim 13, wherein the switchable driver is further configured to:
detect that the digital output is switching between different logic levels;
operate at the first output impedance in response to detecting that the digital output is switching between different logic levels; and
operate at the second output impedance after a predetermined amount of time following the detecting.

19. The memory device of claim 18, wherein:
the predetermined amount of time corresponds to a portion of a clock cycle, and
the clock cycle is about two nanoseconds (2 ns).

20. A driver circuit, comprising:
a first driver circuit configured to drive an output signal;
a second driver circuit comprising an output operably coupled to an output of the first driver circuit;
means for enabling the second driver circuit to drive the output signal in parallel with the first driver circuit in response to determining that the output signal is switching between different logic levels; and means for disabling the second driver circuit after a determined delay period following the determining, wherein a magnitude of an output impedance of the second driver circuit is less than a magnitude of an output impedance of the first driver circuit.

21. The driver circuit of claim 20, wherein the output of the first driver circuit and the output of the second driver circuit are operably coupled to a memory line and are configured to deliver memory operation bias voltage potentials to a plurality of memory cells operably coupled to the memory line.

* * * * *